(12) United States Patent
Rong et al.

(10) Patent No.: US 10,204,887 B2
(45) Date of Patent: Feb. 12, 2019

(54) REFLECTIVE SOLDER MASK LAYER FOR LED PHOSPHOR PACKAGE

(71) Applicant: Lumileds LLC, San Jose, CA (US)

(72) Inventors: Yiwen Rong, San Mateo, CA (US); Frederic Stephane Diana, Santa Clara, CA (US); Ting Zhu, San Jose, CA (US); Gregory Guth, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/103,474

(22) PCT Filed: Nov. 26, 2014

(86) PCT No.: PCT/IB2014/066349
§ 371 (c)(1),
(2) Date: Jun. 10, 2016

(87) PCT Pub. No.: WO2015/092579
PCT Pub. Date: Jun. 25, 2015

(65) Prior Publication Data
US 2016/0315069 A1 Oct. 27, 2016

Related U.S. Application Data

(60) Provisional application No. 61/917,421, filed on Dec. 18, 2013.

(51) Int. Cl.
*H01L 29/18* (2006.01)
*H01L 25/075* (2006.01)
(Continued)

(52) U.S. Cl.
CPC ........ *H01L 25/0753* (2013.01); *H01L 33/501* (2013.01); *H01L 33/505* (2013.01);
(Continued)

(58) Field of Classification Search
CPC . H01L 25/0753; H01L 33/501; H01L 33/505; H01L 33/60; H01L 33/62;
(Continued)

(56) References Cited

U.S. PATENT DOCUMENTS 6,120,883 A * 9/2000 Litman ................ C09D 7/1216
428/207
7,329,905 B2 2/2008 Ibbetson et al.
(Continued)

FOREIGN PATENT DOCUMENTS

CN 102315185 A 1/2012
EP 2500623 A1 9/2012
(Continued)

OTHER PUBLICATIONS

EPO as ISA, International Search Report and Written Opinion dated Mar. 25, 2015 from International Application No. PCT/IB2014/066349, filed Nov. 26, 2014, 12 pages.

*Primary Examiner* — Victor A Mandala
*Assistant Examiner* — Colleen E Snow
(74) *Attorney, Agent, or Firm* — Volpe and Koenig, P.C.

(57) ABSTRACT

A mounting substrate (40) has a patterned metal layer defining a plurality of top metal bond pads for bonding to bottom metal bond pads of LED dies. A solder mask layer (52) is formed over the mounting substrate, where the mask has openings that expose the top metal bond pads and protects metal traces on the substrate. The mask layer is a highly reflective white paint. The exposed top metal bond pads are then wetted with solder. The LED dies' bottom metal bond pads are then soldered to the exposed top metal bond pads, such that the mask layer surrounds each LED die to reflect light. A reflective ring (60) is affixed to the substrate to surround the LED dies. A viscous phosphor material (62) then partially fills the ring and is cured. All (Continued)

downward light by the LED dies and phosphor is reflected upward by the ring and solder mask layer.

10 Claims, 2 Drawing Sheets

(51) Int. Cl.
  *H01L 33/60* (2010.01)
  *H01L 33/62* (2010.01)
  *H01L 33/50* (2010.01)
(52) U.S. Cl.
  CPC .............. *H01L 33/60* (2013.01); *H01L 33/62* (2013.01); *H01L 2933/0033* (2013.01); *H01L 2933/0041* (2013.01); *H01L 2933/0058* (2013.01); *H01L 2933/0066* (2013.01)
(58) Field of Classification Search
  CPC ..... H01L 2933/0033; H01L 2933/0041; H01L 2933/0058; H01L 2933/0066
  See application file for complete search history.

(56) References Cited

U.S. PATENT DOCUMENTS

| | | | |
|---|---|---|---|
| 7,368,817 B2 | 5/2008 | Pendse | |
| 8,828,753 B2 | 9/2014 | Ebe et al. | |
| 9,681,566 B2 | 6/2017 | Bemmerl et al. | |
| 2005/0270755 A1* | 12/2005 | Tsai | H05K 3/3447 361/760 |
| 2010/0283933 A1 | 11/2010 | Schaeffer et al. | |
| 2012/0168795 A1 | 7/2012 | Liu | |
| 2012/0302124 A1 | 11/2012 | Imazu | |
| 2013/0010495 A1 | 1/2013 | Moon et al. | |
| 2013/0109136 A1* | 5/2013 | Foote | H01L 24/83 438/115 |
| 2013/0193465 A1* | 8/2013 | Xu | H01L 33/504 257/98 |
| 2013/0264970 A1 | 10/2013 | Kuan et al. | |
| 2013/0322115 A1* | 12/2013 | Parker | F21V 9/10 362/608 |
| 2013/0328070 A1* | 12/2013 | Hussell | H01L 33/62 257/88 |
| 2014/0103384 A1 | 4/2014 | Takigawa et al. | |

FOREIGN PATENT DOCUMENTS

| | | |
|---|---|---|
| JP | 2012-089357 A | 5/2012 |
| JP | 2012-174808 A | 9/2012 |
| JP | 2012-227293 A | 11/2012 |
| JP | 2012-243846 A | 12/2012 |
| WO | 2011147636 A1 | 12/2011 |
| WO | 2013063030 A1 | 5/2013 |

* cited by examiner

REFLECTIVE SOLDER MASK LAYER FOR LED PHOSPHOR PACKAGE

CROSS-REFERENCE TO RELATED APPLICATIONS

The present application is a § 371 application of International Application No. PCT/IB2014/066349 filed on Nov. 26, 2014 and entitled "REFLECTIVE SOLDER MASK LAYER FOR LED PHOSPHOR PACKAGE," which claims priority to U.S. Provisional Patent Application No. 61/917,421 filed Dec. 18, 2013. Both PCT/IB2014/066349 and 61/917,421 are incorporated herein.

FIELD OF THE INVENTION

This invention relates to packages for phosphor-converted light emitting diodes (pcLEDs) and, in particular, to a package that increases light extraction.

BACKGROUND

For high brightness applications, it is common to mount an array of LED dies on a substrate, where the substrate has metal traces that interconnect the LED dies and lead to anode and cathode electrodes for connection to a power supply. It is common for the LED dies to be GaN-based and emit blue light, where a phosphor (e.g., a YAG phosphor) is deposited over all the LED dies. The combination of the blue light leaking though the phosphor and the yellow-green phosphor light creates white light.

Some light from the LED dies and some light from the phosphor is emitted in the downward direction and is partially absorbed by the substrate. Further, if the individual LED dies are also mounted on submounts (typically much larger than the LED die), and the submount electrodes are bonded to the substrate, the submount surface also absorbs some of the LED and phosphor light. Such absorption by the substrate and submount reduces the overall efficiency of the module.

What is needed is a packaging technique for phosphor-converted LEDs that results in more light being emitted by the package.

SUMMARY

In one example of the invention, a starting substrate comprises aluminum for sinking heat. A thin dielectric layer is formed over the top surface of the substrate, and metal traces are patterned over the dielectric. The metal traces define small-area solder pads for a plurality of LED dies, larger anode and cathode electrodes (also solder pads) for the module, and interconnections between the LED dies and electrodes.

In one embodiment, screen printing is used to deposit a solder mask over the substrate. The solder mask deposits a dielectric that has openings exposing the various electrodes and LED die solder pads. The dielectric is a highly reflective material, such as a binder including $TiO_2$, $ZiO_2$, $VO_2$, or other suitable reflective particles, that scatter and reflect any impinging light. The reflective material may be the same white paint that is used in integrating spheres, with a reflectivity greater than about 94%.

Next, the LED die electrodes are soldered to the exposed solder pads. The solder mask openings may be small enough such that the peripheries of the LED dies align with or overhang the reflective material, so that any downward light from the LED dies will be reflected by the reflective material.

A reflective ring, forming vertical walls, is then affixed to the substrate to surround the array of LED dies.

A phosphor is then deposited within the ring (the ring is also used as a mold) to encapsulate the LED dies and wavelength convert the light emitted from the LED dies. The phosphor also serves to conduct heat away from the LED dies. In one embodiment, the LED dies emit blue light, and the blue light plus the phosphor light creates white light.

The LED dies may or may not include a submount. A submount is typically used to simplify handling, add mechanical strength, and/or to provide robust and simple electrodes for soldering to a circuit board. If such a submount is used, the submount is as small as practical so as to not intercept the downward light from the LED semiconductor layers.

Dome lenses may be molded over the LED dies prior to the deposition of the phosphor for improving light extraction.

The reflective solder mask adds no additional steps, yet greatly improves the efficiency of the LED module.

Other embodiments are described.

BRIEF DESCRIPTION OF THE DRAWINGS

Elements that are the same or similar are labeled with the same numeral.

DETAILED DESCRIPTION

Figure 1:
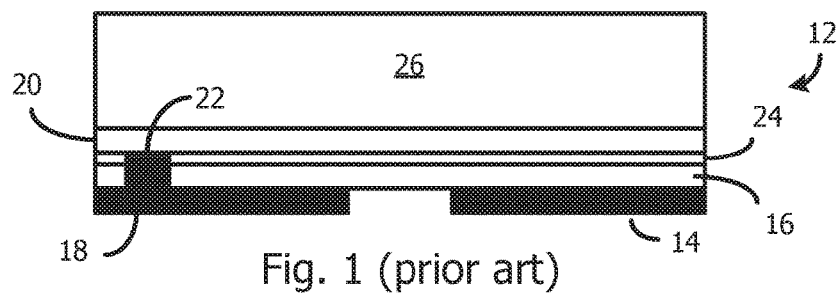
FIG. 1 is a cross-sectional view of a prior art LED die.

FIG. 1 illustrates a conventional LED die 12. Although a flip-chip die is shown in the examples, the present invention is applicable to any type of LED die, including vertical LED dies, lateral LED dies, etc.

The LED die 12 includes a bottom anode electrode 14 coupled to a p-layer 16 and a bottom cathode electrode 18 coupled to an n-layer 20 by a conductor 22 that fills in an etched opening, covered with a dielectric, in the p-layer 16 and active layer 24. The electrode configuration may be more complex and include distributed electrodes for better spreading of current across the LED die 12. The active layer 24 generates light having a peak wavelength. In one example, the peak wavelength is a blue wavelength, and the layers 16, 20, and 24 are GaN-based.

The layers 16, 20, and 24 are epitaxially grown over a substrate 26, such as sapphire. Alternatively, the growth substrate may be removed and replaced by a transparent support substrate affixed to the semiconductor layers by an adhesive or by other techniques. Alternatively, there is no support substrate, although handling of the thin LED semiconductor layers becomes more difficult.

Figure 2:
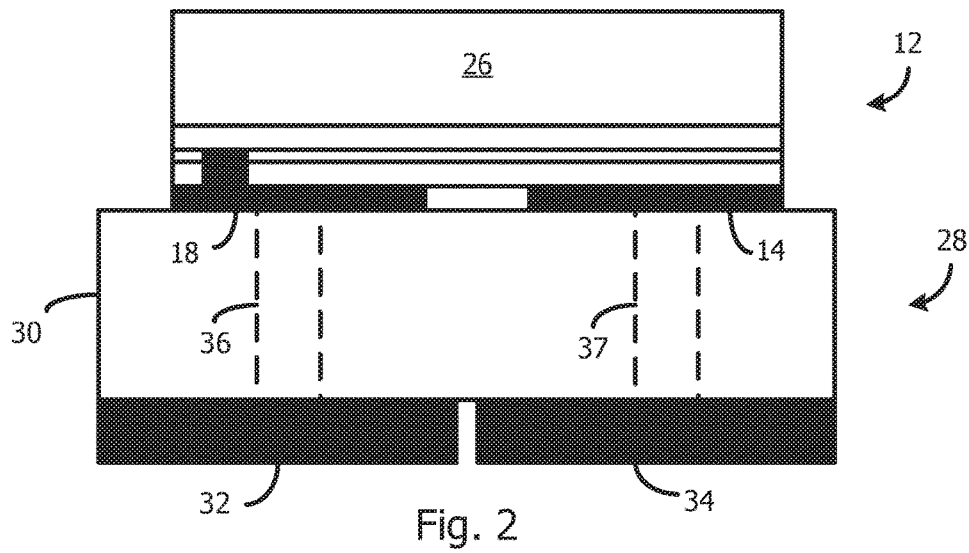
FIG. 2 is a cross-sectional view of an LED die mounted on a minimal-area submount.

As shown in FIG. 2, the LED die 12 may be optionally mounted on a submount 28 for ease of handling, mechanical support, heat sinking, and simplifying the electrode structure for mounting on a printed circuit board. The submount 28 includes a thermally conductive body 30, bottom electrodes 32 and 34, and vias 36 and 37 connecting the bottom electrodes 32/34 to the LED die electrodes 14/18. Additional pads (not shown) on the submount surface are used to connect the LED die electrodes 14/18 to the vias 36/37. The typical submount is much larger than the LED die 12 to accomplish the above-mentioned functions. However, in the preferred embodiment of the invention, when using a submount, it is desirable to make the submount much smaller than the typical size to minimize light absorption by the submount surface. In one embodiment, the growth substrate 26 is removed after the LED die 12 is mounted on the submount 28.

The term "LED die" hereinafter refers to either the bare chip (e.g., FIG. 1) or the chip mounted on a submount (e.g., FIG. 2).

Figure 3:
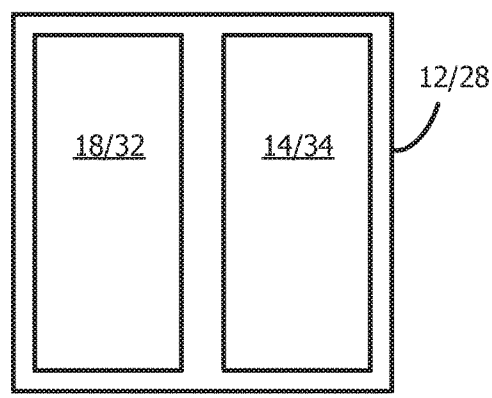
FIG. 3 is a bottom view of an LED die or a submount showing the electrode pattern.

FIG. 3 illustrates a possible bottom electrode configuration for either the LED die 12 or the submount 28.

In the remaining figures, it is assumed a submount is not used. However, the LED die/submount may be substituted for the bare LED die 12 in the remaining figures.

Figure 4:
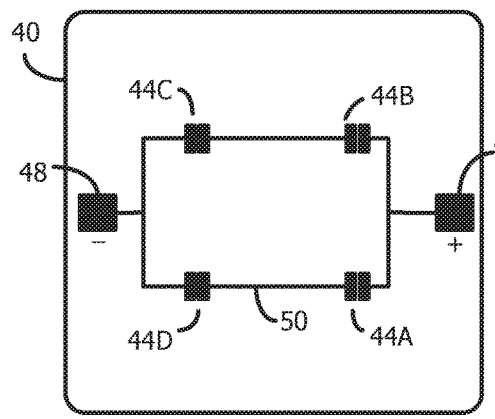
FIG. 4 is a top down view of an aluminum substrate having a dielectric layer and a patterned metal layer.
Figure 7:
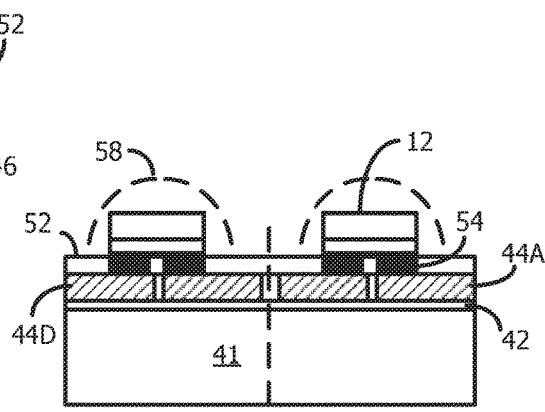
FIG. 7 is a magnified cross-sectional view, along line 7-7 in FIG. 5, of a portion of the substrate of FIG. 5 showing two LED dies having optional lenses.

FIG. 4 is a top down view of a substrate 40 for an array of LED dies 12. FIG. 7 shows a cross sectional view of the substrate 40. The substrate 40 may include a body 41 formed of aluminum or an alloy for heat sinking. The substrate 40 may have any shape, such as rectangular, circular, etc. The length or diameter of the substrate 40 depends on the number of LED dies it supports and will typically range from 1 cm to 4 cm. The substrate 40 is typically connected in an array of substrates by narrow connectors that are later cut for singulation to simplify handling and speed processing.

A non-conductive dielectric layer 42 (FIG. 7) is formed over the body 41 for electrical insulation.

A patterned metal layer, such as copper, is formed over the dielectric layer 42 to define small solder pad groups 44A, 44B, 44C, and 44D for each of the LED dies 12 in the array, and to define larger solder pads 46 and 48 for the array's anode and cathode electrodes. The solder pad groups 44A-D may include one or more heat sink connections. The metal layer also forms interconnections 50 between the LED dies 12 and the electrodes 46 and 48. In the example, only four LED dies 12 are connected in series and parallel. In other embodiments, more or fewer LED dies 12 may be interconnected in series and/or parallel to achieve the desired electrical characteristics and flux.

A problem with the related prior art LED modules is that a significant portion of the LED light emitted downward is absorbed by the mounting substrate. The most absorption by the substrate occurs in the vicinity of each LED die 12, since that is where the light is the brightest. The present invention minimizes such absorption.

Figure 5:
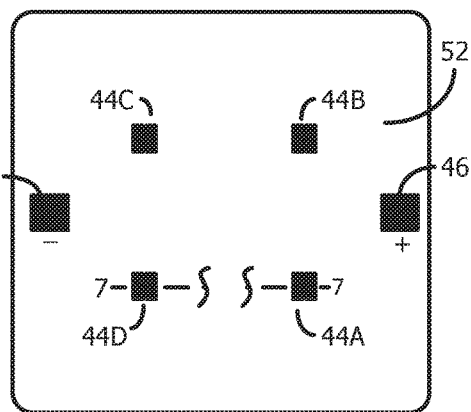
FIG. 5 illustrates the substrate FIG. 4 after deposition of a reflective solder mask, exposing the solder pads.

In FIG. 5, a white (diffusing) paint 52 is screen printed over the substrate 40 in all places except where solder is to be applied. FIG. 7 is a discontinuous cross-section along line 7-7 in FIG. 5 and shows the paint 52 in cross-section. The screen is a mesh that is patterned to block the deposition of the white paint 52 over the solder pad groups 44A, 44B, 44C, and 44D. The white paint 52 is a viscous dielectric that is then cured. Accordingly, the white paint 52 replaces a conventional solder mask, and no additional steps are required. A solder mask restricts any deposited solder, such as molten solder that flows over the substrate 40, to areas that are exposed by the mask.

Examples of a diffusing white paint include a binder (such as silicone) infused with particles of $TiO_2$, $ZiO_2$, $VO_2$, or other suitable reflective scattering particles.

In another embodiment, the white paint is applied, in conjunction with a mask, by jetting, spraying, a photolithography process with evaporation, or other technique.

Commercially available white paints are greater than 94% reflective for visible wavelengths and are sometimes used in integrating spheres for light measurement. The white paint 52 material should be thermally conductive. Preferably, the reflectivity of the white paint 52 is at least 90% for visible light.

By applying the white paint 52 as the solder mask, it is ensured that the reflective material extends to the edge of the LED dies 12 and even under the LED dies 12 between the electrodes. Accordingly, the white paint 52 maximizes the reflective surface area of the substrate, limits the applied solder to only the areas exposed by the solder mask, and acts as a corrosion barrier for the metal traces, without any added process steps, so there is synergy in the inventive process.

In another embodiment, a conventional solder mask material (e.g., used for non-LED circuit boards) is applied directly over the substrate 40 followed by the deposition of the white paint 52 (using the same mask pattern) if the conventional solder mask material is desired for adequate protection of the substrate 40 and to reduce costs. In such a case, the white paint 52 protects the solder mask material from degrading due to the high intensity blue or UV light.

A solder 54 (FIG. 7) is then applied to the various solder pads for wetting. The solder 54 may be screen-printed, or applied with a solder mask, or applied in any other conventional way. The solder 54 may be a solder paste.

Figure 6:
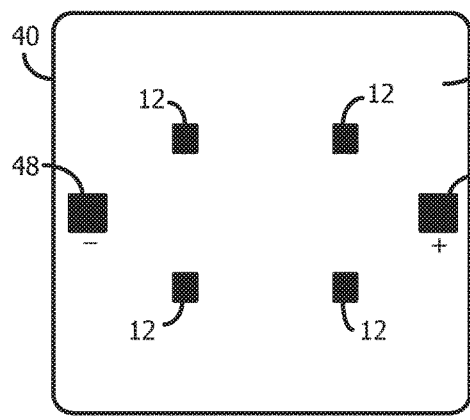
FIG. 6 illustrates the substrate of FIG. 5 after LED dies have been soldered to the solder pads.

In FIG. 6, the LED die 12 electrodes (or submount electrodes) are soldered to the substrate's solder pads using a heating process. As seen, there is no gap between the white paint 52 and the edge of the LED dies 12. If the LED dies were vertical LED dies, only the bottom electrode would be directly soldered to one of the substrate's 42 solder pads, and the top electrode would be wire-bonded to another solder pad. If the LED dies were lateral LED dies, the bottom thermal pad would be soldered to one of the substrate's 42 solder pads and both top electrodes would be wire-bonded to associated solder pads. In virtually all LED dies, there is at least one bottom metal bond pad that serves as an electrical and/or thermal pad.

In another embodiment, solder is not used. Instead the bonding may be by an ultrasonic weld, a conductive adhesive (electrically and thermally conductive), or using other techniques. In such cases, the "solder mask" would be referred to by a suitable name but would still define the areas on the substrate 40 where the bottom metal bond pad of the LED die is to be bonded, and the exposed areas would be approximately the size of the LED die.

FIG. 7 is a compressed and magnified cross-sectional view of a portion of the substrate 40 along line 7-7 in FIG. 5 cutting across two of the LED dies 12 in the horizontal direction. A solder 54 is shown connecting the LED die electrodes to the solder pad groups 44A and 44D.

Domed lenses 58 may optionally be molded over the LED dies 12 for improved light extraction and protection of the LED dies 12. In an alternative embodiment, LED dies 12 may be enclosed in domed lens prior to soldering, with or without a submount.

Figure 8:
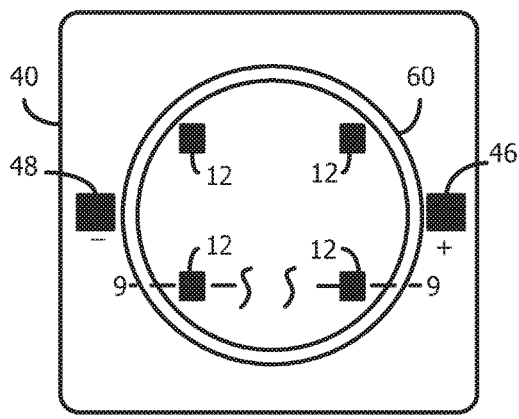
FIG. 8 is a top down view of the substrate of FIG. 6 after a reflective ring is affixed around the array of LED dies.

In FIG. 8, a reflective ring 60 is affixed to the surface of the substrate 40, surrounding the array of LED dies 12. The ring 60 may be a reflective metal or a material coated with a reflective layer. The ring 60 may be affixed with silicone or epoxy.

Figure 9:
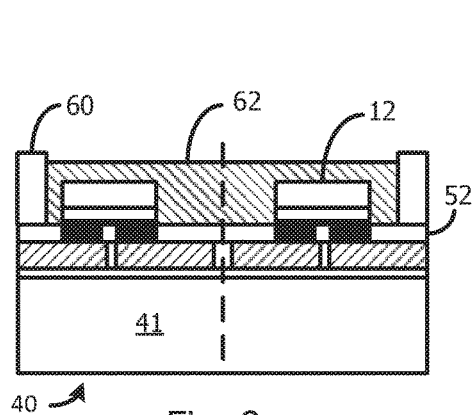
FIG. 9 is a magnified cross-sectional view, along line 9-9 in FIG. 8, of a portion of the substrate of FIG. 8 illustrating the ring being at least partially filled with an encapsulating phosphor mixture.

FIG. 9 is a compressed and magnified cross-sectional view of a portion of the substrate 40 along line 9-9 in FIG. 8 cutting across two of the LED dies 12 in the horizontal direction and the ring 60, where walls of the ring 60 extend above the tops of the LED dies 12 and reflect and mix the light.

As also shown in FIG. 9, a viscous phosphor mixture 62 is deposited within the ring 60, acting as a mold, and cured. The phosphor mixture 62 may be a mixture of silicone and phosphor particles. Many ways to deposit the phosphor mixture 62 are envisioned, such as by using a syringe, screen printing, positioning a pre-formed tablet in the ring that is then melted, etc. The phosphor mixture 62 encapsulates the LED dies 12 for added protection.

The thickness of the phosphor mixture 62 and phosphor particle density are controlled to achieve the desired combination of blue light leakage and phosphor conversion. The phosphor may be a single phosphor (e.g., YAG) or a combination of phosphors (e.g., YAG and red, or green and red, etc.) to achieve the desired color emission.

Preferably, the indices of refraction of the various layers are selected to provide a transition from the high index GaN to the low index of air to minimize total internal reflection (TIR).

The reflective surface of the substrate 40 under the phosphor mixture 62 reflects back over 94% of all the phosphor light emitted in a downward direction.

Any number of LED dies 12 may be mounted on the substrate 40, and the diameter of the ring 60 is that needed to surround the LED dies 12 and may be adjusted accordingly. Any number of the resulting substrates 40 can be connected in a system to achieve any desired flux. In one embodiment, the resulting structure emits white light. Other emission colors are possible by selecting different LED dies and phosphors. A quantum dot material may be substituted for the phosphor mixture 62.

An improvement in efficiency of greater than 10% is typically achieved by using the invention.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
   a light emitting diode (LED) die having a plurality of electrodes formed thereon;
   a mounting substrate having a patterned metal layer defining at least one metal bond pad;
   a dielectric solder mask layer disposed on the at least one metal bond pad of the mounting substrate, the mask layer having a plurality of openings that expose portions of the at least one bond pad, the mask layer being formed of a reflective material that reflects at least 90% of visible light and restricts deposited molten solder to the plurality of openings;
   solder disposed in the plurality of openings of the mask layer and in contact with the at least one metal bond pad of the mounting substrate and respective electrodes of the plurality of electrodes of the LED die such that the at least one metal bond pad of the LED die is soldered to the at least one other metal bond pad, wherein the mask layer completely surrounds the LED die and is disposed under the LED die between the plurality of electrodes to reflect light;
   a pre-formed ring that is affixed to the solder mask layer, the ring having reflective internal walls that extend above the height of the first LED die and surround the LED die;
   a wavelength conversion material at least partially filling the ring such that the wavelength conversion material covers the LED die and a portion of the mask layer; and
   a lens disposed over the LED die that separates the wavelength conversion layer from the LED die.

2. The device of claim 1, wherein the LED die comprises LED semiconductor layers mounted on a submount.

3. The device of claim 1, wherein the first wavelength conversion material comprises a phosphor.

4. The device of claim 1, wherein the wavelength conversion material comprises quantum dots.

5. The device of claim 1, wherein the reflective ring serves as a mold for the wavelength conversion material.

6. The device of claim 1, wherein the reflective material comprises a white paint.

7. The device of claim 1, wherein the reflective material comprises reflective particles in a binder.

8. The device of claim 1, further comprising:
   a plurality of other LED dies having associated metal bond pads,
   wherein the patterned metal layer on the mounting substrate defines a plurality of metal bond pads corresponding to the metal bond pads of the other LED dies,
   wherein the mask layer has a plurality of openings that expose at least a portion of each of the plurality of metal bond pads of the mounting substrate corresponding to the metal bond pads of the other LED dies, and
   wherein the plurality of metal bond pads of the plurality of other LED dies are bonded to the exposed at least the portion of the plurality of metal bonds pads of the mounting substrate corresponding to the metal bond pads of the other LED dies, such that the mask layer surrounds each of the plurality of other LED dies.

9. The device of claim 8, wherein the patterned metal layer interconnects the LED die and the plurality of other LED dies and is covered by the mask layer.

10. A method of forming a light emitting structure comprising:
    providing a mounting substrate having a patterned metal layer defining a plurality of metal bond pads;
    depositing a dielectric solder mask layer on the plurality of metal bond pads, the mask layer having a plurality of openings that expose at least a portion of each of the plurality of metal bond pads, the mask layer being formed of a reflective material that reflects at least 90% of visible light and restricts deposited molten solder to the plurality of openings; and
    bonding a respective electrode of a plurality of electrodes of associated light emitting diode (LED) dies to the exposed at least a portion of each of the plurality of metal bond pads of the mounting substrate by applying molten solder to fill the plurality of openings in the mask layer such that the mask layer completely surrounds each of the plurality of LED dies and is disposed under the LED die between the plurality of electrodes to reflect light;

providing a pre-formed ring having reflective internal walls;

affixing the pre-formed ring to the solder mask layer, such that the reflective internal walls of the ring extend above the height of the LED dies and surround the LED dies;

at least partially filling the ring with a wavelength conversion material such that the wavelength conversion material covers the LED dies and a portion of the mask layer; and providing a lens over the LED die that separates the wavelength conversion material from the LED die.

* * * * *